United States Patent [19]
Liao et al.

[11] Patent Number: 6,046,109
[45] Date of Patent: Apr. 4, 2000

[54] CREATION OF LOCAL SEMI-INSULATING REGIONS ON SEMICONDUCTOR SUBSTRATES

[75] Inventors: Chungpin Liao, Taichung, Taiwan; Denny D. Tang, Saratoga, Calif.; Shin-Chii Lu, Hsinchu, Taiwan

[73] Assignee: Industrial Technology Research Institute, Hsin-Chu, Taiwan

[21] Appl. No.: 08/998,734

[22] Filed: Dec. 29, 1997

[51] Int. Cl.[7] .................................................. H01L 21/302
[52] U.S. Cl. .......................... 438/689; 438/403; 438/407; 438/423
[58] Field of Search .................................... 438/403, 407, 438/423, 689

[56] References Cited

U.S. PATENT DOCUMENTS

| | | | |
|---|---|---|---|
| 4,084,986 | 4/1978 | Aoki et al. | 148/1.5 |
| 4,244,097 | 1/1981 | Cleary | 29/571 |
| 4,474,623 | 10/1984 | Adlerstein | 29/579 |
| 4,609,407 | 9/1986 | Masao et al. | 148/1.5 |
| 4,677,740 | 7/1987 | Shifrin et al. | 29/571 |
| 4,872,040 | 10/1989 | Jackson | 557/16 |
| 5,051,786 | 9/1991 | Nicollian et al. | 357/4 |
| 5,362,678 | 11/1994 | Komaru et al. | 437/203 |
| 5,366,926 | 11/1994 | Mei et al. | 437/173 |
| 5,496,768 | 3/1996 | Kudo | 437/174 |
| 5,585,288 | 12/1996 | Davis et al. | 437/38 |

FOREIGN PATENT DOCUMENTS 58-087879  5/1983  Japan .

OTHER PUBLICATIONS

"Ion implantation in 6H–SiC", Rao et al., Nuclear Instrument. Methods Phys, Res. Sect. B (1997); Abstract Only.
"Fabrication of Silicon MOSFET's Using Neutron–Irradiated Silicon As Semi–Insulating Substrate"; IEEE Trans. Electron Devices (1982); ED–29(4); Abstract Only; Ho et al.
Buchmann et al."Lithography With High Depth of Focus By An Ion Projection System", Micro Electro Mechanical Systems.'92, Travemunde (Germany) Feb. 1992, p67–71.

*Primary Examiner*—William Powell
*Assistant Examiner*—George Goudreau
*Attorney, Agent, or Firm*—George O. Saile; Stephen B. Ackerman

[57] ABSTRACT

The present invention solves the problem of how to form local regions of semi-insulating material within a single crystal substrate. It does this by irradiating the semiconductor with a high energy beam capable of producing radiation damage along its path. As a consequence of such radiation damage the resistivity of the semiconductor in the irradiated area is increased by several orders of magnitude, causing it to become semi-insulating. Semi-insulating regions of this type are effective as electrically isolating regions and can be used, for example, to decouple analog from digital circuits or to maintain high Q in integrated inductors after these devices have been made. The radiation used could be electromagnetic (such as X-rays or gamma rays) or it could comprise energetic particles such as protons, deuterons, etc. Confinement of the beam to local regions within the semiconductor is accomplished by means of suitable masks.

16 Claims, 2 Drawing Sheets

CREATION OF LOCAL SEMI-INSULATING REGIONS ON SEMICONDUCTOR SUBSTRATES

FIELD OF THE INVENTION

The invention relates to the general field of integrated circuits with particular reference to the formation of semi-insulating regions therein.

BACKGROUND OF THE INVENTION

The need often arises in integrated circuits (ICs) to electrically isolate various regions from one another. At the digital device level a number of techniques are already in use, including LOCOS (local oxidation of silicon) and STI (shallow trench isolation). These techniques insure good electrical isolation of various regions from one another but they are time consuming to implement and consume significant real estate on the wafer surface. A particular limitation of these techniques is that they are useful only for regions that are relatively close to the wafer surface.

There are, however, a number of situations where the isolating region needs to extend to a significant depth below the surface including, in some cases, all the way through to the other surface of the wafer. Examples include reduction of substrate noise coupling, realization of high Q inductors on silicon mixed mode ICs, reduction of transmission line loss for high frequency ICs, and the separation of different types of devices such as analog from digital or bipolar from CMOS.

In FIGS. 1 and 2 we show two examples of devices in which isolating regions that extend all the way through an integrated circuit wafer would be advantageous but which are difficult to implement using current state of the art techniques. In FIG. 1 single crystal semiconductor wafer 1 (typically silicon but possibly other semiconductors such as germanium, gallium arsenide, silicon/germanium, indium phosphide, gallium nitride, and silicon carbide) contains both an MOS circuit 2 as well as micro-strip 3 and high Q inductor 4. Metal ground layer 6 covers the entire underside of the wafer. In order to fully decouple the inductor and the microstrip from the integrated circuit, an isolating region such as 5 has to be provided.

FIG. 2 shows semiconductor wafer 1 on whose surface are three different types of circuit. For example, circuit 22 could be an MOS circuit, circuit 23 could be a bipolar circuit, and circuit 24 could be an analog circuit. As in the previous example, it is necessary to decouple these different circuits from one another. This can be achieved if isolating regions such as 25 can be provided. Such regions will need to extend all the way through the wafer, as shown.

The existing art does not offer any teachings relating to low cost effective methods for forming regions such as 5 in FIG. 1 or 25 in FIG. 2. The available technology appears to have focussed on the inverse problem of how to form a low resistivity region within an insulating or high resistivity wafer:

Nicollian et al. (U.S. Pat. No. 5,051,786 September 1991) show how quantum wells can be formed from polycrystalline material by suitable passivation of the grain boundaries. Mei et al. (U.S. Pat. No. 5,366,926 November 1994) show how amorphous silicon may be hydrogenated by the application of a laser beam. Kudo (U.S. Pat. No. 5,496,768 March 1996) also uses laser beams to manufacture polysilicon thin films while Masao et al. (U.S. Pat. No. 4,609,407 September 1986) disclose a method of making three dimensional semiconductor devices in regions that have been selectively regrown. Ion projection systems are discussed by Buchmann et al. in Micro Electro Mechanical Systems '92 Travemunde (Germany) February 1992 pp. 67–71.

SUMMARY OF THE INVENTION

It is therefore an object of the present invention to provide a process for the formation of electrical isolating regions in semiconductors.

Another object of the invention is that said isolating a regions be capable of extending to substantial depths below the semiconductor surface, including all the way through to the opposite surface.

A further object has been that said process be fully compatible with existing methods of manufacturing integrated circuits, both analog and digital.

These objects have been achieved by irradiating the semiconductor with a high energy beam capable of producing radiation damage along its path. As a consequence of such radiation damage the resistivity of the semiconductor in the irradiated area is increased by several orders of magnitude, causing it to become semi-insulating. Semi-insulating regions of this type are effective as electrically isolating regions and can be used, for example, to decouple analog from digital circuits or to maintain high Q in integrated inductors. The radiation used could be electromagnetic (such as X-rays or gamma rays) or it could comprise energetic particles such as protons, deuterons, etc. Confinement of the beam to selected regions within the semiconductor is accomplished by means of suitable masks. Semi-insulating regions formed in this manner are stable provided they are not exposed to temperatures in excess of about 400° C. For this reason they are not formed until all other processing of the IC has been completed.

DESCRIPTION OF THE PREFERRED EMBODIMENTS

Figure 1:
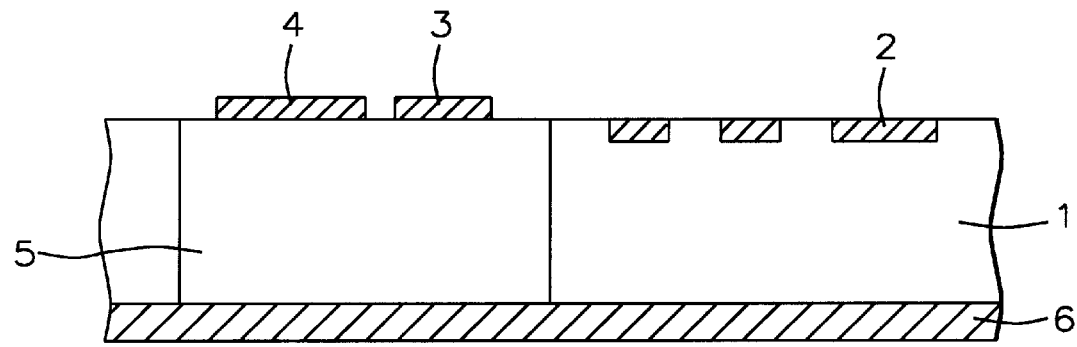
FIG. 1 shows how an MOS circuit can be effectively decoupled from a micro-strip and a high Q inductor with which it shares the same semiconductor substrate.

As discussed above, there is a need for isolating regions (in integrated circuits) that extend all or most of the way through the thickness of semiconductor wafers. Ideally such isolating regions would be high quality insulators but, fortunately, regions that are more aptly referred to as 'semi-insulating' or 'high resistivity' may be used for isolation purposes with little or no loss of performance.

One way in which a given region within a single crystal semiconductor may be transformed from semiconducting to semi-insulating is by introducing radiation damage into it. The effects of, for example, a proton beam on silicon are illustrated in the following example:

Both N and P type silicon samples were measured before and after being subjected to penetrating radiation by a proton beam having a particle energy between about 10 and 30 MeV for a total dosage between 1 and 10 microamp-hours. The results were as shown in TABLE I:

TABLE I

| | Hall mobility sq. cm./volt sec. | | carrier density per cc. | | resistivity ohm-cm. | |
|---|---|---|---|---|---|---|
| | P | N | P | N | P | N |
| Before | 450 | 1,500 | $3 \times 10^{14}$ | $2 \times 10^{14}$ | 6–10 | 6–10 |
| After | 80 | 130 | $2 \times 10^{11}$ | $5 \times 10^{11}$ | $>10^5$ | $>10^5$ |

It is important to note that these changes in resistivity were permanent, as long as the samples were not exposed to temperatures in excess of about 500° C. for more than a few seconds or to temperatures in excess of about 400° C. for more than 100 hours. Since such temperatures may be encountered during normal processing, an important feature of the invention is that it is to be applied at the very end of the manufacturing sequence.

In order to induce adequate radiation damage (for the purposes of the invention) in a semiconductor both electro-magnetic as well as particle radiation may be used. For the electromagnetic radiation, photon energies in excess of about 1 keV are required (implying the use of X-rays or gamma rays) while for particles energies in excess of about 1 MeV should be used. Typical particle beams that may be used include protons, deuterons, tritons, alpha particles, nitrogen ions, and oxygen ions. It is also possible to use ionized molecules for the beams.

As indicated above, minimum beam energies are about 100 keV and 1 MeV for the electromagnetic and the particle beams respectively. The actual energy that is used will depend on the depth of penetration desired for the beam. The data in TABLE II gives a rough guide as to the optimum energy:

TABLE 2

| Penetration depth | beam energy | |
|---|---|---|
| (silicon) | electromag. | particle (H$^+$) |
| 10 microns | 1 keV | 1 MeV |
| 50 microns | 5 keV | 2 MeV |
| 1 mm | 10 keV | 15 MeV |

In general, it will be desired to convert only very limited areas or regions to semi-insulation. Thus it becomes necessary to protect most of the semiconductor from the beam during irradiation This can be readily accomplished by means of masks formed from high atomic weight materials having sufficient thickness to stop the beam. Examples are aluminum, iron, and tungsten, having a thickness between about 0.1 and 2 mm. At these thicknesses, the dimensions of the irradiated areas can be controlled to within about 0.3 microns if used in conjunction with a high precision "direct write" ion beam projection system.

Figure 3:
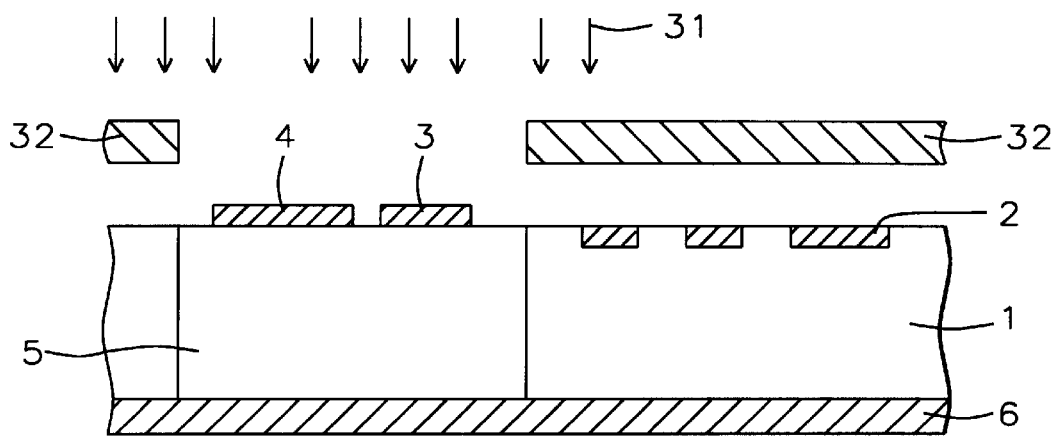
FIG. 3 shows how the structure postulated in FIG. 1 may be realized by application of the present invention.

Two embodiments of the invention are illustrated. In FIG. 3 semiconductor substrate 1 is seen to include both an MOS circuit 2 as well as micro-strip 3 and high Q inductor 4. Metal ground layer 6 covers the entire underside of the wafer. In order to decouple the inductor and the microstrip from the integrated circuit, an isolating region (such as 5 in FIG. 1) is needed. This is accomplished, in this example, by irradiating the substrate with x-ray beam 31. Said beam has an intensity of between about 100 and 1,000 kGy/hr. and a photon energy between about 1 keV and 10 keV. It is applied at room temperature for between about 10 and 100 days. Mask 32, positioned between about 1 and 5 mm. above the surface of substrate 1, serves to protect the upper surface of 1 everywhere except where it is desired to form the isolating region. As will be seen in the second embodiment described below, this can be accomplished with significantly greater efficiency using a particle beam.

Figure 2:
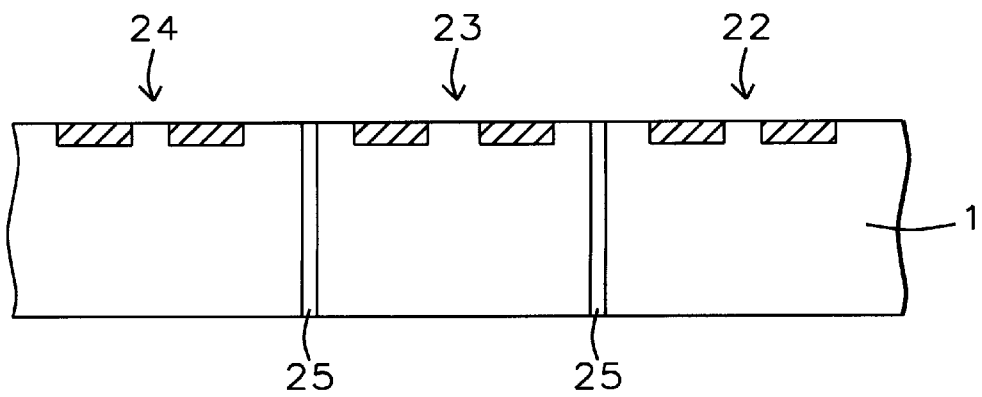
FIG. 2 shows how three different types of circuit, such as an MOS circuit, a bipolar circuit, and an analog circuit, that share the same substrate, can be electrically isolated from one another.
Figure 4:
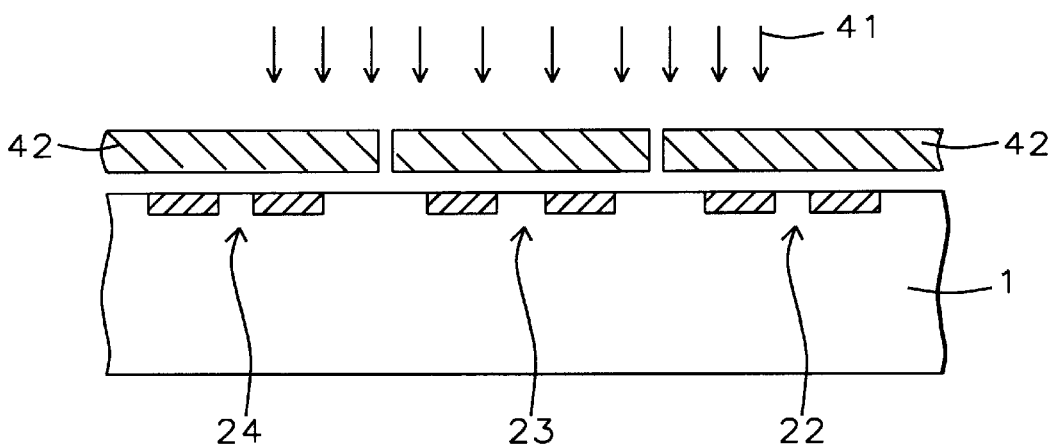
FIG. 4 shows how the structure postulated in FIG. 2 may be realized by application of the present invention.

In FIG. 4 semiconductor substrate 1 is seen to include three different types of circuit: MOS circuit 22, bipolar circuit 23, and analog circuit 24. In order to decouple these different circuits from one another isolating regions (such as 25 in FIG. 2) must be provided. Such regions will need to extend all the way through the wafer. This is accomplished, in this example, by irradiating the substrate with particle beam 41. Said beam comprises protons (hydrogen ions), has an intensity of between about 1 and 10 microamps and a particle energy between about 1 and 30 MeV. It is applied at room temperature for between about 1 and 60 minutes to achieve a total dosage between about 0.1 and 10 microamp-hours. Mask 42, positioned between about 1 and 5 mm. above the surface of substrate 1, serves to protect the upper surface of 1 everywhere except where it is desired to form the isolating regions.

While the invention has been particularly shown and described with reference to the preferred embodiments thereof, it will be understood by those skilled in the art that various changes in form and details may be made without departing from the spirit and scope of the invention.

What is claimed is:

1. A process for forming a semi-insulating region within a single crystal semiconductor body, comprising:
   irradiating said region with high energy electromagnetic radiation.

2. The process of claim 1 wherein the semiconductor is selected from the group consisting of silicon, germanium, gallium arsenide, silicon/germanium, indium phosphide, gallium nitride, and silicon carbide.

3. The process of claim 1 wherein said electromagnetic radiation has a photonic energy greater than about 1 keV.

4. A process for forming a semi-insulating region within a single crystal semiconductor body, comprising:
   irradiating said region with a high energy beam of ionized multi-atom molecules.

5. The process of claim 4 wherein the semiconductor is selected from the group consisting of silicon, germanium, gallium arsenide, silicon/germanium, indium phosphide, gallium nitride, and silicon carbide.

6. The process of claim 4 wherein the particles have energies greater than about 1 MeV.

7. The process of claim 4 wherein the particles are selected from the group consisting of deuterons, tritons, alpha particles, molecular nitrogen ions, and molecular oxygen ions.

8. A process for forming a local area of semi-insulating material within a single crystal semiconductor body, comprising:
   providing a beam of high energy electromagnetic radiation;
   protecting the semiconductor body from said beam everywhere other than at said local area; and
   irradiating the region with the beam.

9. The process of claim 8 wherein the step of protecting the semiconductor body further comprises:
   providing a mask of radiation opaque material selected from the group consisting of aluminum, iron, tungsten, and chromium, and having a thickness between about 0.1 and 2 mm.

10. The process of claim 8 wherein the semiconductor is selected from the group consisting of silicon, germanium, gallium arsenide, silicon/germanium, indium phosphide, gallium nitride, and silicon carbide.

11. The process of claim 8 wherein said electromagnetic radiation has a photonic energy greater than about 1 keV.

12. A process for forming a local area of semi-insulating material within a single crystal semiconductor body, comprising:

providing a beam of high energy ionized multi-atom molecules;

protecting the semiconductor body from said beam everywhere other than at said local area; and irradiating the region with the beam.

13. The process of claim 12 wherein the step of protecting the semiconductor body further comprises:

providing a mask of radiation opaque material selected from the group consisting of aluminum, iron and tungsten, and having a thickness between about 0.1 and 2 mm.

14. The process of claim 12 wherein the semiconductor is selected from the group consisting of silicon, germanium, gallium arsenide, silicon/germanium, indium phosphide, gallium nitride, and silicon carbide.

15. The process of claim 12 wherein the particles have energies greater than about 1 MeV.

16. The process of claim 12 wherein the particles are selected from the group consisting of deuterons, tritons, alpha particles, molecular nitrogen ions, and molecular oxygen ions.

\* \* \* \* \*